United States Patent [19]

Hidaka

[11] Patent Number: 4,774,691

[45] Date of Patent: Sep. 27, 1988

[54] SEMICONDUCTOR MEMORY DEVICE

[75] Inventor: Hideto Hidaka, Hyogo, Japan

[73] Assignee: Mitsubishi Denki Kabushiki Kaisha, Tokyo, Japan

[21] Appl. No.: 929,371

[22] Filed: Nov. 12, 1986

[30] Foreign Application Priority Data

Nov. 13, 1985 [JP] Japan .................................. 60-257085
Dec. 6, 1985 [JP] Japan .................................. 60-275567

[51] Int. Cl.$^4$ .............................................. G11C 7/00
[52] U.S. Cl. ...................................... 365/203; 365/233
[58] Field of Search .............. 365/189, 203, 204, 230, 365/233

[56] References Cited

U.S. PATENT DOCUMENTS 4,044,339 8/1977 Berg ...................................... 365/189
4,636,987 1/1987 Norwood et al. ............... 365/189 X

OTHER PUBLICATIONS

"A 60 ns 256K×1 Bit DRAM Using LD$^3$ Technology and Double-Level Metal Interconnection", R. A. Kertis et al, IEEE Journal of Solid-State Circuits, vol. SC-19, No. 5, Oct. 1984, pp. 585-589.

"A 1-Mbit CMOS DRAM with Fast Page Mode and Static Column Mode" IEEE JNL. of Solid State Circuits, vol. SC-20, No. 5, Oct. 1985.

Primary Examiner—Joseph A. Popek
Attorney, Agent, or Firm—Lowe, Price, LeBlanc, Becker & Shur

[57] ABSTRACT

An active pull-up circuit driving system 2 starts, sequentially with a prescribed time lag, active pull-up operation of the bit lines in memory cell array blocks MA1 to MA4, so that a peak value of electric current consumed at the time of starting active pull-up operation can be reduced. A precharge circuit driving system 3 starts, sequentially with a prescribed time lag, precharge operation of the bit lines in the memory cell array blocks MA1 to MA4, so that a peak value of electric current consumed at the time of starting bit line precharging operation can be reduced.

8 Claims, 9 Drawing Sheets

FIG.10

SEMICONDUCTOR MEMORY DEVICE

BACKGROUND OF THE INVENTION

1. Field of the Invention

The present invention relates to a semiconductor memory device and particularly to a semiconductor memory device such as a dynamic RAM comprising an active pull-up circuit.

2. Description of the Prior Art

In a dynamic MOS RAM, an active pull-up circuit operates after sense amplification of a bit line potential according to data stored in memory cells, whereby the bit line potential on the side of a high level is pulled up to a voltage equal to or higher than a power supply voltage Vcc.

Figure 1:
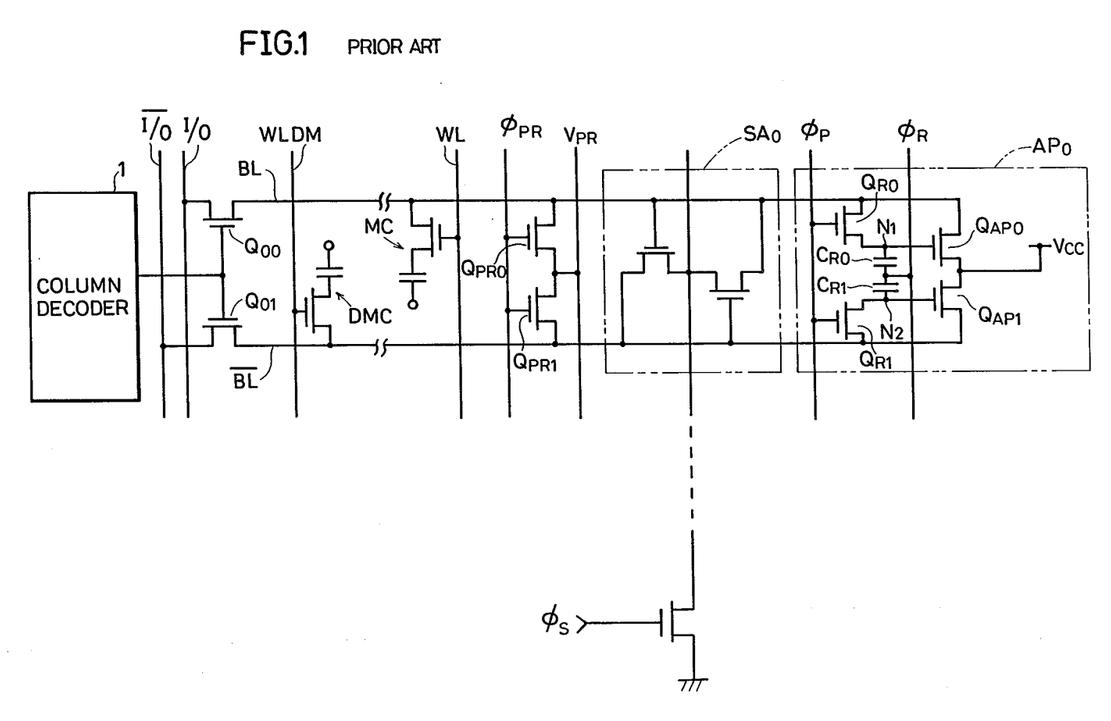
FIG. 1 is a circuit diagram showing a bit line sense system in a conventional dynamic RAM.

FIG. 1 is a circuit diagram showing a bit line sense system in a conventional dynamic RAM. Referring to FIG. 1, a pair of bit lines BL and $\overline{BL}$ are connected to data buses I/O and $\overline{I}$/ through transistors $Q_{00}$ and $Q_{01}$, respectively. On-off control of those transistors $Q_{00}$ and $Q_{01}$ is made by an output of a column decoder 1. Memory cells MC of a 1-transistor 1-capacitor type are connected to each pair of bit lines in an alternate manner. FIG. 1 shows only one memory cell MC for the purpose of simplification of the illustration. Each memory cell MC is connected with a word line WL. Connection or disconnection of the memory cells MC with or from the bit lines BL and $\overline{BL}$ is controlled by selection of the word lines WL. A dummy memory cell DMC is connected to each of the bit lines BL and $\overline{BL}$. FIG. 1 shows only one dummy memory cell DMC connected to the bit line $\overline{BL}$. Those dummy memory cells DMC are connected with dummy word lines WLDM. Connection or disconnection of the dummy memory cells with or from the bit lines BL and $\overline{BL}$ is controlled by selection of the dummy word lines WLDM. A precharge voltage supply $V_{PR}$ is connected to the bit lines BL and $\overline{BL}$ through transistors $Q_{PR0}$ an $Q_{PR1}$, respectively. On-off control of the transistors $Q_{PR0}$ and $Q_{PR1}$ is made by a clock signal $\phi_{PR}$.

In addition, a sense amplifier SAo and an active pull-up circuit APo are connected to each pair of bit lines BL and $\overline{BL}$. The sense amplifier SAo serves to detect a potential of the bit lines after selection of a memory cell to bring the potential of the bit line of the low level to a ground level. Operation of the sense amplifier SAo is controlled by a clock signal $\phi_S$. The active pull-up circuit APo comprises transistors $Q_{AP0}$, $Q_{R0}$ and a capacitor $C_{R0}$ associated with the bit line BL, as well as transistors $Q_{AP1}$, $Q_{R1}$ and a capacitor $C_{R1}$ associated with the bit line $\overline{BL}$. The transistor $Q_{AP0}$, which is provided between the bit line BL and a power supply Vcc, serves to pull up the bit line BL. The capacitor $C_{R0}$ serves to increase a gate potential of the transistor $Q_{AP0}$. An end of the capacitor $C_{R0}$ is connected to a gate of the transistor $Q_{AP0}$ and the other end thereof receives a clock signal $\phi_R$. The transistor $Q_{R0}$ serves to precharge the capacitor $C_{R0}$ with a precharge voltage of the bit line BL and this transistor $Q_{R0}$ is provided between the bit line BL and the above stated one end of the capacitor $C_{R0}$. The respective gates of these transistors $Q_{R0}$ and $Q_{R1}$ receive the clock signal $\phi_P$. The transistors $Q_{R1}$, $Q_{AP1}$ and the capacitor $C_{R1}$ as the circuit elements associated with the bit line $\overline{BL}$ are arranged symmetrically with respect to the transistors $Q_{R0}$, $Q_{AP0}$ and the capacitor $C_{R0}$ as the circuit elements associated with the bit line BL.

In reality, a semiconductor memory comprises a plurality of pairs of bit lines BL and $\overline{BL}$ and memory cells MC associated with those pairs of bit lines BL and $\overline{BL}$ are arranged in a matrix.

Figure 2:
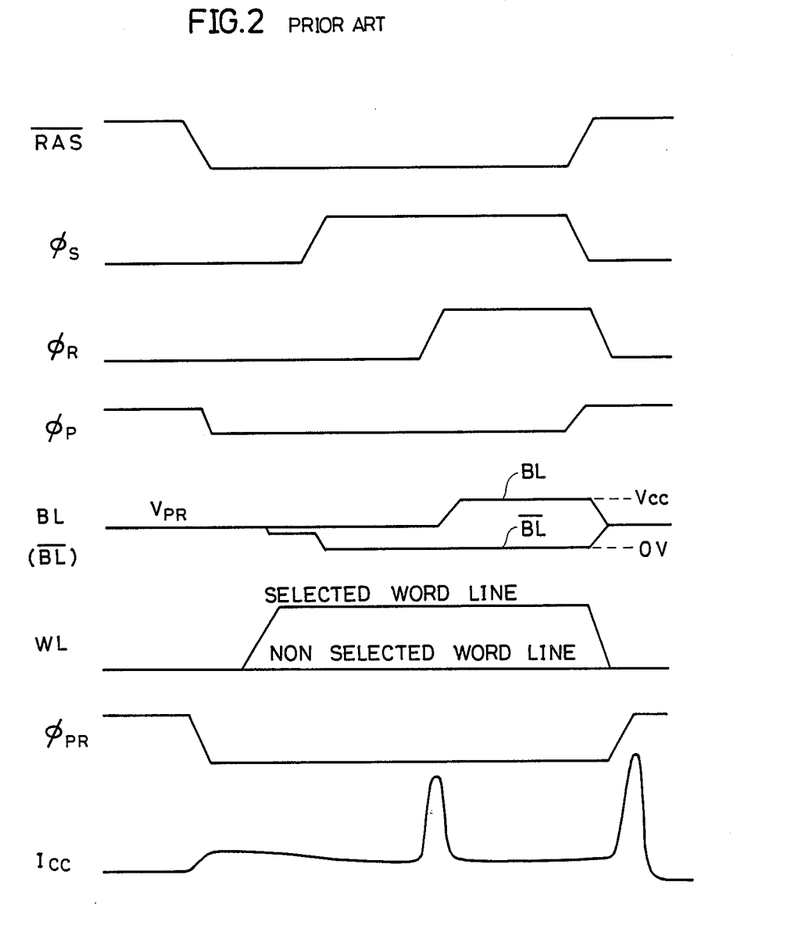
FIG. 2 is a timing chart showing operation timing in the circuit shown in FIG. 1.

FIG. 2 is a timing chart showing operation timing of the circuit shown in FIG. 1. Referring to FIG. 2, $\phi_S$, $\phi_R$, $\phi_P$ and $\phi_{PR}$ correspond to the respective clock signals shown in FIG. 1; BL and $\overline{BL}$ represent change in the potential of the bit lines BL and $\overline{BL}$; and WL represents change in the potential of the word line WL. $\overline{RAS}$ represents a row address strobe signal. The row address strobe signal $\overline{RAS}$ is a signal for defining a non-active period and an active period. In addition, Icc represents change in current flowing from the power supply to the semiconductor memory device shown in FIG. 1. In the following, operation of the circuit in FIG. 1 will be dscribed with reference to FIG. 2.

First, the row address strobe signal $\overline{RAS}$ falls to start the active period. In this active period, a row address signal (not shown) is latched and the latched row address signal is supplied to a row address decoder (not shown). The row address decoder decodes the row address signal supplied thereto and provides an output. In response to this output, any one of the word lines WL and any one of the dummy word lines WLDM connected to the row address decoder are selected and rise to a high level. As a result, a potential difference is caused in the pair of bit lines BL and $\overline{BL}$ according to the information stored in the memory cell MC and the dummy memory cell DMC associated with the selected lines. After that, the clock signal $\phi_S$ rises to enable the sense amplifier SAo so that the bit line of the low potential is brought to the ground potential. Then, the clock signal $\phi_R$ rises to start active pull-up operation. In this active pull-up operation, the bit line of the high level is pulled up from the precharge voltage $V_{PR}$ to the power supply voltage Vcc, oppositely to sense amplifying operation. For example, let us assume that the bit line of the high level is BL out of the pair of bit lines BL and $\overline{BL}$. Since a node N1 of the gate of the transistor $Q_{AP0}$ and the capacitor $C_{R0}$ is maintained in advance at the precharge voltage $V_{PR}$ of the bit line BL by turning on of the transistor $Q_{R0}$, the node N1 rises to a voltage higher than the power supply voltage Vcc by boost effect of the capacitor $C_{R0}$ when the clock signal $\phi_R$ rises. As a result, the transistor $Q_{AP0}$ is conducted to a high degree and the bit line BL is pulled up to the power supply voltage Vcc. On the other hand, as for the bit line $\overline{BL}$ of the low level, the potential at a node N2 of the gate of the transistor $Q_{AP1}$ and the capacitor $C_{R1}$ is equal to the ground level and consequently if the clock signal $\phi_R$ rises, the potential at the node N2 does not rise and the transistor $Q_{AP1}$ does not turn on. Thus, the active pull-up circuit APo pulls up only the bit line of the high level to the power supply voltage Vcc.

When the above stated active pull-up operation is performed, half of the total number of bit lines are changed from the precharge voltage $V_{PR}$ to the power supply voltage Vcc and as a result consumption of electric current Icc from the power supply presents an acute peak as shown in FIG. 2. In addition, when the active period comes to an end after the rise of the row address strobe signal $\overline{RAS}$, the selected word line WL and dummy word line WLDM fall so that all of the bit lines are precharged with $V_{PR}$. At this time also, consumption of electric current Icc from the power supply presents an acute peak as shown in FIG. 2.

The peak values of the electric current Icc at the time of active pull-up operation and at the time of precharging bit lines are considerably large. Accordingly, requirements for a power supply capacity of a memory system become severe.

A conventional method for decreasing such peak current at the time of precharging bit lines is indicated for example in "A 60 ns 256K×1 Bit DRAM Using LD³ Technology and Double-Level Metal Interconnection", IEEE Journal of Solid-State Circuits, vol. SC-19, No. 5, pp. 585 October, 1984, in which a memory cell array, namely, a semiconductor memory device is divided into a plurality of blocks and precharging operation for bit lines is started sequentially with a time lag for each block.

However, according to such a conventional method as disclosed in the above stated document, a peak current at the time of precharging bit lines can be decreased but a peak current at the time of active pull-up operation can not be reduced.

If an active cycle is terminated before the completion of active pull-up operation, the high level stored in the memory cell is lowered, causing a large influence in effective margin for operation of the memory. For this reason, in such a method as in the above stated document in which precharging operation for bit lines is started with a time lag for each block, it is necessary to assure a sufficiently long period for active pull-up operation from the start of pull-up operation in each block (performed simultaneously for each block) till the start of a non-active period of the block where precharging operation for bit lines is started first. However, in such case, a period of time from the start of active pull-up operation to the start of precharging operation for bit lines becomes unnecessarily long in blocks where precharging operation for bit lines is started late, and a memory cycle period as a whole is made unfavorably long.

SUMMARY OF THE INVENTION

An object of the present invention is to provide a semiconductor memory device in which at least a peak current caused by active pull-up operation can be decreased.

Briefly stated, the present invention is directed to a semiconductor memory device which is divided into a plurality of blocks so that active pull-up operation is started sequentially with a time lag for each block.

According to the present invention, a peak value of electric current consumed at the time of active pull-up operation can be decreased and a capacity required for power supply of a memory system can be reduced. Thus, it becomes possible to use a power supply of a small capacity and to reduce the running cost and consumption of electric power.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
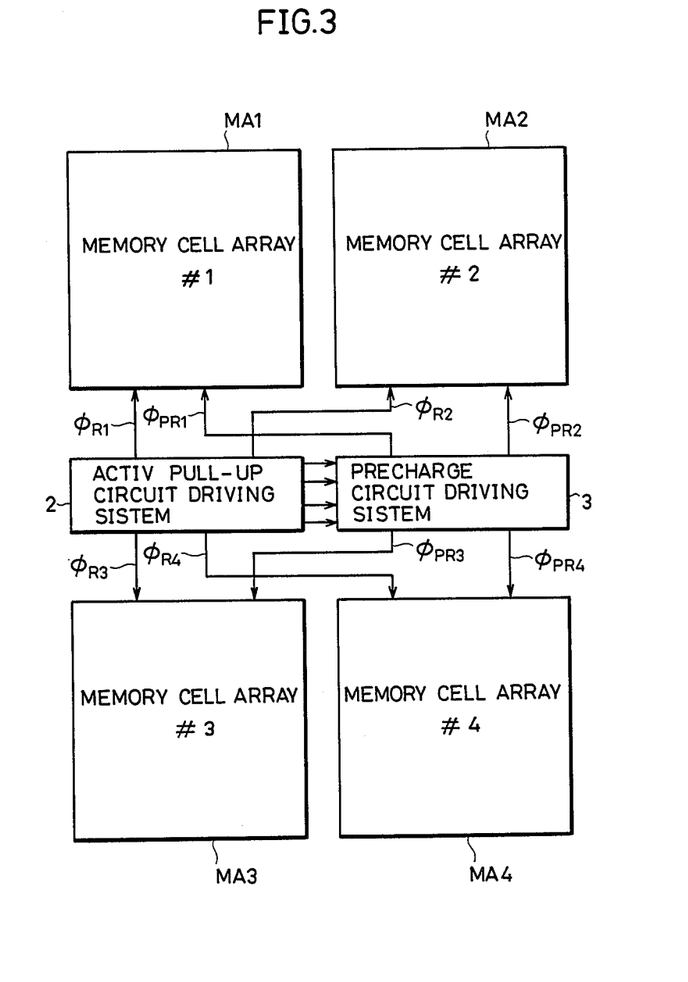
FIG. 3 is a schematic block diagram showing an embodiment of the present invention.

FIG. 3 is a schematic block diagram showing an embodiment of the present invention. Referring to FIG. 3, a memory cell array which was provided as a single block in a conventional device is divided for example into four blocks MA1 to MA4 in this embodiment. Accordingly, a memory capacity of each block is decreased to ¼ of the total capacity. However, each block has the same construction as that of the conventional device in FIG. 1. Therefore, the same reference numerals as in FIG. 1 are employed for description of the construction in each block. An active pull-up circuit driving system 2 generates, sequentially with a predetermined time lag, clock signals $\phi_{R1}$, $\phi_{R2}$, $\phi_{R3}$ and $\phi_{R4}$ for starting active pull-up operation and supplies those clock signals to the blocks MA1, MA2, MA3 and MA4, respectively. More specifically, the clock signals $\phi_{R1}$ to $\phi_{R4}$ for starting active pull-up operation are supplied to the respective active pull-up circuits APo of the blocks MA1 to MA4 so that they perform the same function in the respective blocks as that of the clock signal $\phi_R$ in the conventional example shown in FIG. 1. Thus, the blocks MA1 to MA4 start active pull-up operation in response to the clock signals $\phi_{R1}$ to $\phi_{R4}$, respectively. A precharge circuit driving system 3 generates, sequentially with a predetermined time lag, clock signals $\phi_{PR1}$, $\phi_{PR2}$, $\phi_{PR3}$ and $\phi_{PR4}$ for starting bit line precharging operation and supplies those clock signals to the blocks MA1, MA2, MA3 and MA4. More specifically, the clock signals $\phi_{PR1}$ to $\phi_{PR4}$ for starting bit line precharging operation are supplied to the gates of the transistors $Q_{PR0}$ and $Q_{PR1}$ in the blocks MA1 to MA4, respectively, so that they function in the same manner as in the clock signal $\phi_{PR}$ in the conventional example shown in FIG. 1. Thus, the blocks MA1 to MA4 start bit line precharging operation in response to the clock signals $\phi_{PR1}$ to $\phi_{PR4}$, respectively.

Figure 4:
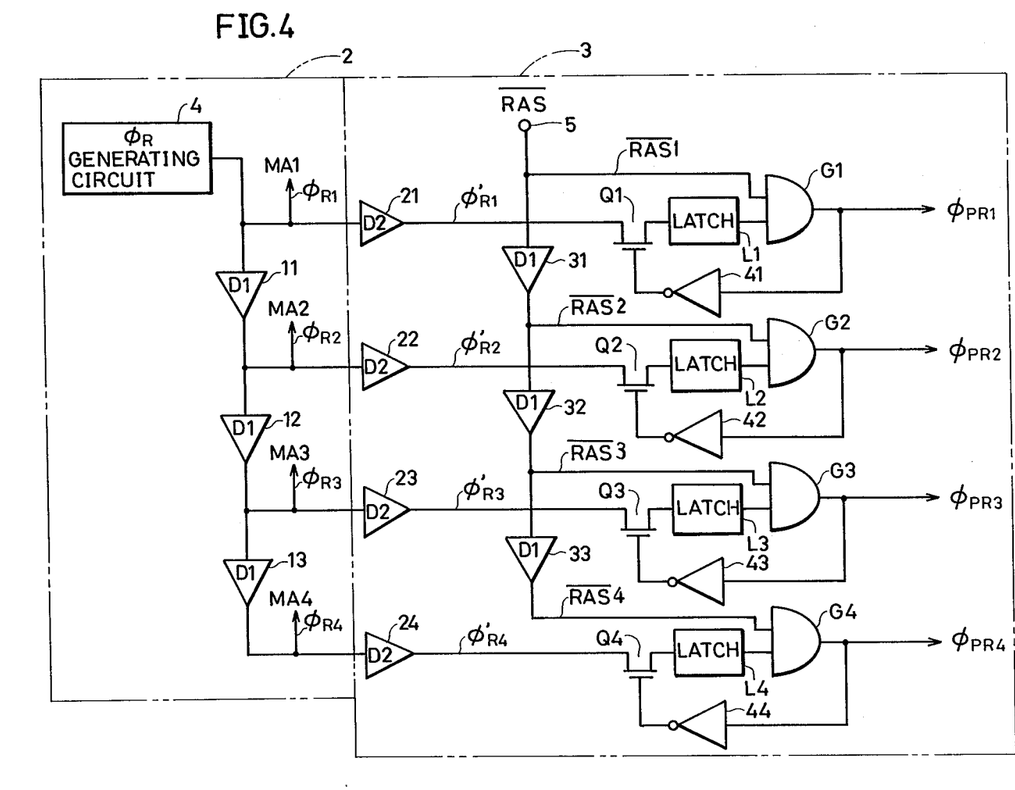
FIG. 4 is a circuit diagram showing in detail the active pull-up circuit driving system 2 and the precharge circuit driving system 3 shown in FIG. 3.

FIG. 4 is a circuit diagram showing in detail the active pull-up circuit driving system 2 and the precharge circuit driving system 3 shown in FIG. 3. Referring to FIG. 4, the active pull-up circuit driving system 2 comprises a $\phi_R$ generating circuit 4 for generating a clock signal which is the same as the clock signal $\phi_R$ used in the circuit in FIG. 1. An output of the $\phi_R$ generating circuit 4 is supplied to the block MA1 as the clock signal $\phi_{R1}$ and is also supplied to the precharge circuit driving system 3. In addition, the output of the $\phi_R$ generating circuit 4 is delayed successively by delay circuits 11, 12 and 13. The delay periods of those delay circuits 11, 12 and 13 are set to the same value D1. The outputs $\phi_{R2}$, $\phi_{R3}$ and $\phi_{R4}$ of the delay circuits 11, 12 and 13 are supplied to the precharge circuit driving system 3 and is also supplied to the blocks MA2, MA3 and MA4, respectively.

On the other hand, in the precharge circuit driving system 3, the clock signals $\phi_{R1}$, $\phi_{R2}$, $\phi_{R3}$ and $\phi_{R4}$ supplied from the active pull-up circuit driving system 2 are delayed by a predetermined period D2 by delay circuits 21, 22, 23 and 24, respectively. The delay period D2 of each of those delay circuits 21 to 24 is set to at least a period required for completion of the operation of the active pull-up circuit APo provided in each of the blocks MA1 to MA4. The outputs $\phi_{R1}'$ to $\phi_{R4}'$ of the delay circuits 21 to 24 are supplied to latch circuits L1 to L4 through transistors Q1 to Q4, respectively. The outputs of those latch circuits L1 to L4 are supplied to inputs of AND gates G1 to G4, respectively. An input terminal 5 receives a row address strobe signal $\overline{RAS}$. The row address strobe signal $\overline{RAS}$ is supplied to the other input of the AND gate G1 as a signal $\overline{RAS1}$ and the row address strobe signal $\overline{RAS}$ is also supplied to the delay circuits 31, 32 and 33 so as to be delayed successively by the predetermined period D1, whereby signals $\overline{RAS2}$, $\overline{RAS3}$ and $\overline{RAS4}$ are provided therefrom respectively. Those signals $\overline{RAS2}$, $\overline{RAS3}$ and $\overline{RAS4}$ are supplied to the other inputs of the AND gates G2, G3 and G4, respectively. The outputs of the AND gates G1 to G4 are supplied to the gates of the transistors Q1 to Q4 through inverters 41 to 44, respectively. The outputs of the AND gates G1 to G4 are supplied to the blocks MA1 to MA4, as the clock signals $\phi_{R1}$ to $\phi_{R4}$ respectively, for starting bit line precharging operation.

Figure 5:
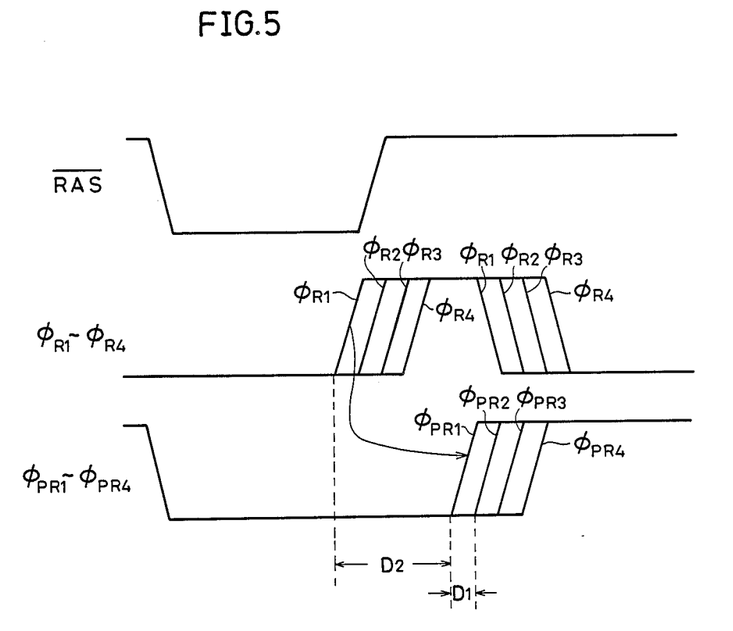
FIGS. 5 and 6 are timing charts showing operation timing in the embodiment shown in FIG. 3.
Figure 6:
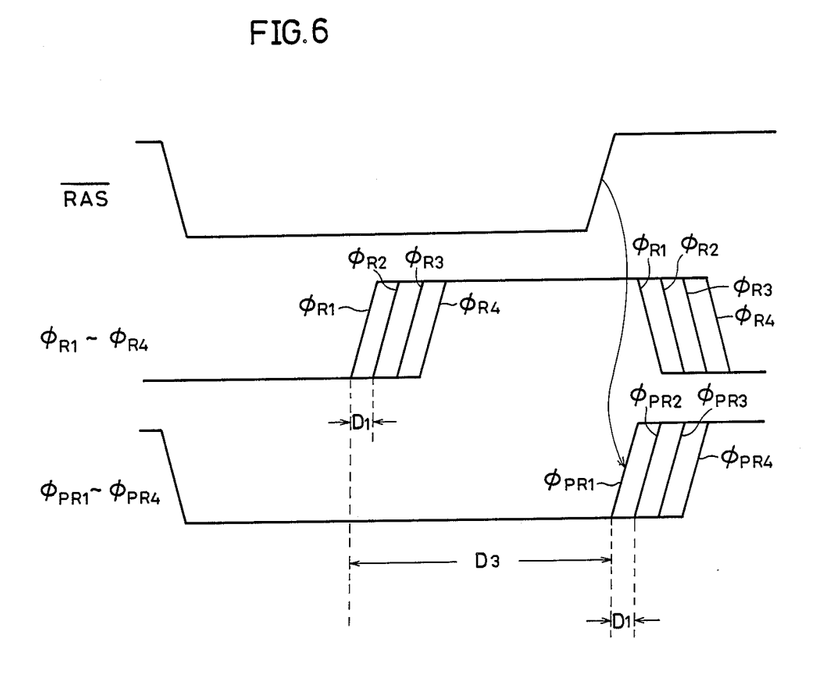

FIGS. 5 and 6 are timing charts for explaining operation of the above described embodiment. FIG. 5 represents a case in which the row address strobe signal $\overline{RAS}$ rises early, while FIG. 6 represents a case in which the row address strobe signal $\overline{RAS}$ rises late to the contrary. In the following, the operation of the above described embodiment will be described with reference to FIGS. 5 and 6.

In either of the above described cases in FIGS. 5 and 6, the clock signals $\phi_{R1}$, $\phi_{R2}$, $\phi_{R3}$ and $\phi_{R4}$ for starting active pull-up operation rise successively with the predetermined delay period D1. In response to such rise, active pull-up operation is started with the predetermined time lag D1 in the blocks MA1 to MA4. As a result, an instantaneous peak current at the time of active pull-up operation is decreased. In addition, in response to the clock signals $\phi_{R1}$ to $\phi_{R4}$, signals $\phi_{R1}$ to $\phi_{R4}'$ rise after a lapse of the predetermined delay period D2, respectively.

Referring now to FIG. 5, the operation in the case of early rise timing of the row address strobe signal $\overline{RAS}$ will be described. In this case, the rise timing of the clock signals $\phi_{PR1}$ to $\phi_{PR4}$ for starting bit line precharging operation is determined by rise timing of the signals $\phi_{R1}'$ to $\phi_{R4}'$ as the delay signals of the clock signals $\phi_1$ to $\phi_4$. The reason for this will be described in the following. For example, let us consider, as a typical case, the clock signal $\phi_1$PR1. Since the row address strobe signal $\overline{RAS}$ has risen early, the signal $\overline{RAS1}$ has also risen to the high level early in response thereto. Since the output of the AND gate G1 is at the low level at first, the output of the inverter 41 is at the high level. Consequently, the transistor Q1 is in the on state. When the signal $\phi_{PR1}'$ rises in this state, the level of the latch circuit L1 is inverted to the high level and both of the inputs of the AND gate G1 rise to the high level. Accordingly, the output $\phi_{PR1}$ of the AND gate G1 rises to the high level. Thus, in the case of early rise timing of the row address strobe signal $\overline{RAS}$, the rise timing of the clock signal $\phi_{PR1}$ is determined by the rise timing of the signal $\phi_{R1}'$. Since this signal $\phi_{R1}'$ rises after the predetermined delay period D2 from the rise of the clock signal $\phi_{R1}$ for starting active pull-up operation, the length of the period D2 is assured in a period from the start of active pull-up operation to the start of bit line precharging operation. Since the delay period D2 is set to a period equal to or longer than the period required for completion of the active pull-up operation as described above, a sufficiently long period for operation is assured in the active pull-up circuit APo in the block MA1. Consequently, no inconvenience is caused in storage operation. The same operation as in the case of the above stated clock signal $\phi_{PR1}$ is performed in connection with the other clock signals $\phi_{PR2}$, $\phi_{PR3}$ and $\phi_{PR4}$. Those clock signals $\phi_{PR1}$ to $\phi_{PR4}$ rise successively with a time lag corresponding to the prescribed delay period D1. Accordingly, bit line precharging operation is started in the blocks MA1 to MA4 sequentially with the prescribed time lag D1. As a result, an instantaneous peak current at the time of bit line precharging operation is decreased.

Referring now to FIG. 6, operation in the case of late rise timing of the row address strobe signal $\overline{RAS}$ will be described. In this case, the rise timing of the clock signals $\phi_{PR1}$ to $\phi_{PR4}$ is determined by the rise timing of four signals $\overline{RAS1}$ to $\overline{RAS4}$ formed out of the row address strobe signal $\overline{RAS}$. This determination is based on the following reason. In the same manner as in the case of FIG. 5, operation in connection with the clock signal $\phi_{PR1}$ will be described as a typical case. When the signal $\phi_{R1}'$ rises and the level of the latch circuit L1 is inverted to the high level, the signal $\overline{RAS1}$ does not rise yet. Accordingly, the clock signal $\phi_{PR1}$ does not rise at the rise of the signal $\phi_{R1}'$. After that, when the signal $\overline{RAS1}$ rises at the rise of the row address strobe signal $\overline{RAS}$, both of the inputs of the AND gate G1 rise to the high level and as a result the clock signal $\phi_{PR1}$ rises. Thus, in the case of late rise timing of the row address strobe signal $\overline{RAS}$, the rise timing of the clock signal $\phi_{PR1}$ is determined by the rise timing of the signal $\overline{RAS1}$. In this case, the length of the period D3 from the rise of the clock signal $\phi_{R1}$ to the rise of the clock signal $\phi_{PR1}$ depends on the rise timing of the row address strobe signal $\overline{RAS}$. However, it is at least longer than the above described period D2. Therefore, in the same manner as in the case of FIG. 3, a sufficiently long period for operation is assured in the active pull-up circuit APo in the block MA1. The same operation as in the case of the clock signal $\phi_{PR1}$ is performed in connection with the other clock signals $\phi_{PR2}$, $\phi_{PR3}$ and $\phi_{PR4}$. Those clock signals $\phi_{PR1}$ to $\phi_{PR4}$ rise successively with a time lag corresponding to the predetermined delay period D1. Consequently, also in the case of FIG. 6, as in the case of FIG. 5, an instantaneous peak current at the time of starting bit line precharging operation is reduced.

According to the above described embodiment, various effects as described below can be produced.

(1) Since active pull-up operation and bit line precharging operation are both started sequentially with a predetermined time lag in the blocks MA1 to MA4, a peak current at the time of active pull-up operation and a peak current at the time of bit line precharging operation can be reduced. Accordingly, a power supply of a small capacity can be used for a memory system, which is advantageous in view of running cost and consumption of electric power.

(2) Since the timing for starting active pull-up operation in the blocks MA1 to MA4 and the timing for starting bit line prechanging operation are both applied with the prescribed delay period D1, the length of a period for active pull-up operation allotted for each block becomes constant and is never lengthened unnecessarily. Consequently, the memory cycle period can be prevented from being lengthened.

(3) Since the length of a period from the rise of the clock signals $\phi_{R1}$ to $\phi_{R4}$ to the rise of the clock signals $\phi_{PR1}$ to $\phi_{PR4}$, respectively, is set to a period at least equal to or longer than the period required for completion of active pull-up operation, a sufficiently long period for operation can be assured for the active pull-up circuit APo in each block and accordingly there will never be caused any inconvenience in storage operation.

(4) Since the timing for rise of the clock signals $\phi_{PR1}$ to $\phi_{PR4}$ is determined by the timing for either rise of the singals $\phi_{R1}'$ to $\phi_{R4}'$ or rise of the signals $\overline{RAS1}$ to $\overline{RAS4}$ whichever comes the later, a sufficiently long period can always be assured for completion of active pull-up operation even if there is caused a change in the timing for rise of the row address strobe signal $\overline{RAS}$, and in addition, the row address strobe signal $\overline{RAS}$ can be made to correspond to storage operation.

Figure 7:
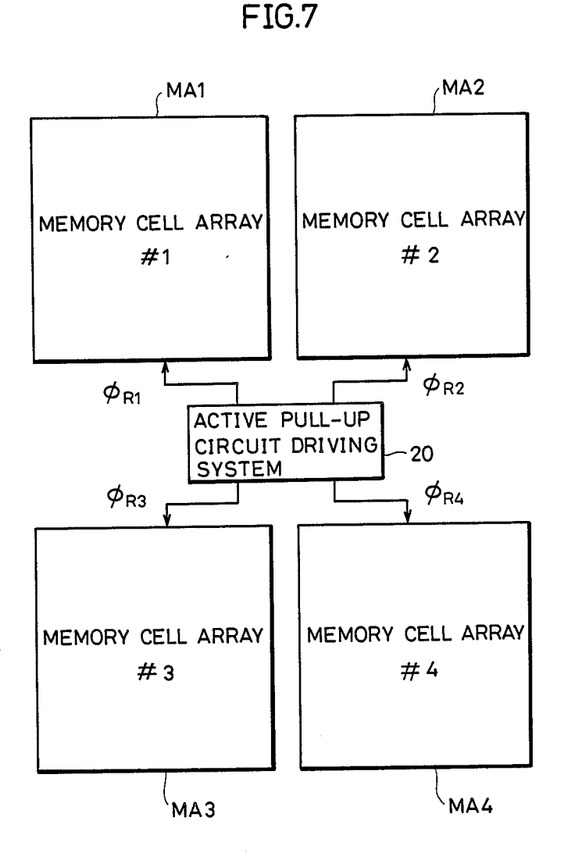
FIG. 7 is a schematic block diagram showing another embodiment of the present invention.
Figure 8:
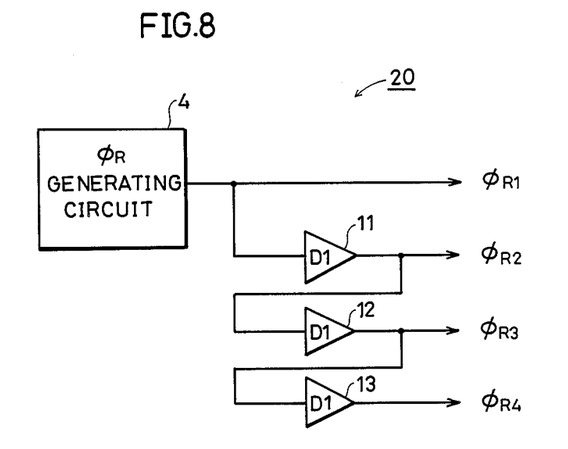
FIG. 8 is a circuit diagram showing in detail the active pull-up circuit driving system 20 shown in FIG. 7.
Figure 9:
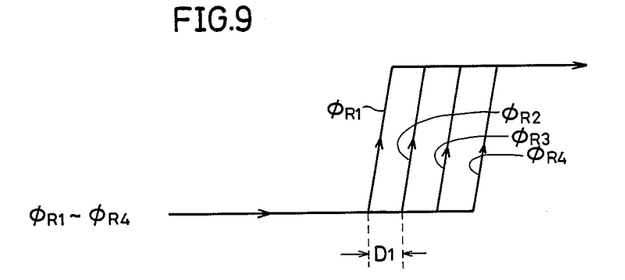
FIG. 9 is a waveform diagram of clock signals 100 $_{R1}$ to $\phi_{R4}$ provided from the active pull-up circuit driving system 20 shown in FIG. 7.

FIG. 7 is a schematic block diagram showing another embodiment of the present invention. In this embodiment in FIG. 7, in the same manner as in the embodiment shown in FIG. 3, a memory cell array is divided into four blocks MA1 to MA4 for example. In addition, this embodiment comprises an active pull-up circuit driving system 20 having the same construction as that of the active pull-up circuit driving system 2 used in the embodiment shown in FIG. 3. More specifically, the active pull-up circuit driving system 20 used in this embodiment comprises, as shown in FIG. 8, a $\phi_R$ generating circuit 4 and three delay circuits 11 to 13 for delaying the output of the $\phi_R$ generating circuit 4. Consequently, the active pull-up circuit driving system 20 generates four clock signals $\phi_{R1}, \phi_{R2}, \phi_{R3}$ and $\phi_{R4}$ each rising with the prescribed delay period D1 as shown in FIG. 9. The blocks MA1 to MA4 start active pull-up operation sequentially with a time lag corresponding to the prescribed delay period D1 in response to the rise of those clock signals $\phi_{R1}$ to $\phi_{R4}$, respectively. As a result, an instantaneous peak current at the time of starting active pull-up operation can be reduced.

Figure 10:
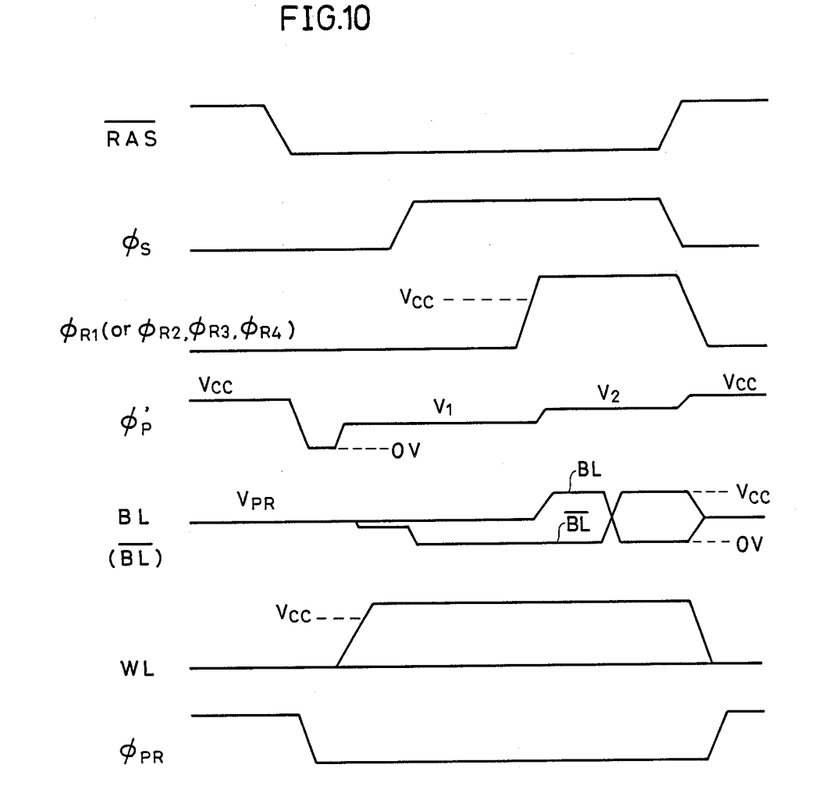
FIG. 10 is a timing chart for explaining operation in the blocks MA1 to MA4 shown in FIG. 7.

Each of the blocks MA1 to MA4 in the embodiment in FIG. 7 has the same construction as in the conventional circuit in FIG. 1, except that a clock signal $\phi_P'$ as shown in FIG. 10 is supplied to the bases of the transistor $Q_{R0}$ and $Q_{R1}$. Accordingly, operation in the blocks MA1 to MA4 differs a little from the operation of the embodiment shown in FIG. 3 and therefore the operation of the embodiment in FIG. 7 will be described in the following, referring to the timing chart in FIG. 10.

First, in the non-active period, namely, in the period of the high level of the row address strobe signal $\overline{RAS}$, the bit lines BL and $\overline{BL}$ are precharged with a prescribed potential. More specifically, the transistors $Q_{PR0}$ and $Q_{PR1}$ are turned on by the clock signal $\phi_{PR}$ so that the bit lines BL and $\overline{BL}$ are precharged with the potential $V_{PR}$. At this time, since the clock signal $\phi_P'$ is at the same potential as the power supply voltage Vcc, the transistors $Q_{R0}$ and $Q_{R1}$ are both turned on and accordingly the capacitors $C_{R0}$ and $C_{R1}$ are charged by the bit lines BL and $\overline{BL}$, respectively.

After that, the row address strobe signal $\overline{RAS}$ falls to start the active period. In this active period, one of the word lines WL and one of the dummy word lines WLDM are selected so that the potentials of the respective selected lines rise. In this case, it is assumed that one of the word lines connected with the memory cells MC on the side of the bit lines BL is selected and that one of the dummy word lines connected with the dummy memory cells DMC on the side of the bit lines $\overline{BL}$ is selected. After the selection, the clock signal $\phi_S$ rises to enable the sense amplifier SAo. As a result, the bit line BL of the low level becomes equal to the ground level. At this time, the clock signal $\phi_P'$ is maintained to the potential V1 which satisfies the condition of the following equation (1).

$$V1 < V_{PR} + V_{R0} \tag{1}$$

In this equation (1), $V_{R0}$ is a threshold voltage of the transistor $Q_{R0}$ and this voltage $V_{R0}$ is also equal to a threshold voltage $VR_1$ of the transistor $Q_{R1}$.

In the above described sense amplifying operation, the potential at the node N1 (the point of connection between the gate of the transistor $Q_{AP0}$ and the capacitor $C_{R0}$) remains at the high level $V_{PR}$ attained by precharging in the non-active period. On the other hand, the potential at the node N2 (the point of connection between the gate of the transistor $Q_{AP1}$ and the capacitor $C_{R1}$) becomes equal to the ground level. This is because the bit line $\overline{BL}$ falls to the ground level by the sense amplifying operation and the transistor $Q_{R1}$ is turned on to cause the electric charge stored in the capacitor $C_{R1}$ to be emitted to the bit line $\overline{BL}$ through the transistor $Q_{R1}$.

Then, when the clock signal $\phi_{R1}$ (or $\phi_{R2}$ or $\phi_{R3}$ or $\phi_{R4}$) rises to start active pull-up operation, the potential at the node N1 rises to a sufficiently high potential by boost effect of the capacitor $C_{R0}$. This is because the potential of the clock signal $\phi_P'$, namely, the gate potential V1 of the transistor $Q_{R0}$ is, at this time, lower than the sum of the precharge potential $V_{PR}$ of the bit line BL and the threshold voltage $V_{R0}$ of the transistor $Q_{R0}$ to cause a low degree of conduction of the transistor $Q_{R0}$, resulting in little flow of the stored electric charge from the capacitor $C_{R0}$. Accordingly, the node N1 is raised to a sufficiently high voltage by the capacitor $C_{R0}$ and as a result the transistor $Q_{AP0}$ is conducted to a high degree to pull up the bit line BL of the high level to the power supply voltage Vcc. On the other hand, the node N2 remains at the ground level and accordingly the transistor $Q_{AP1}$ does not turn on and the bit line $\overline{BL}$ remains at the ground level.

After completion of the above described active pull-up operation, the clock signal $\phi_P'$ is raised to the potential V2 which satisfies the condition of the following equation (2).

$$V2 < Vcc + V_{R0} \tag{2}$$

This is for the purposes of making the gate potential of the transistor $Q_{AP0}$ for pulling up the bit line BL of the high level easily fall to the low level and making the potential of the bit line BL rapidly fall to the low level (the ground level) in case where data is rewritten after the pull-up operation. Consequently, the potential of the clock signal $\phi_P'$ may be raised to V2 only when data is rewritten.

Further, when the row address strobe signal $\overline{RAS}$ rises to start the non-active period, the bit lines BL and $\overline{BL}$ are precharged with the potential $V_{PR}$ and the clock signal $\phi_P'$ rises to the power supply potential Vcc. As a result, the transistors $Q_{R0}$ and $Q_{R1}$ are in the on state to cause the nodes N1 and N2 to be precharged with the same potential as that of the bit lines BL and $\overline{BL}$ in the same manner as in the above described conventional circuit.

In the case of using the clock signal $\phi_P'$ as described above, boosting of the capacitor $C_{R0}$ or $C_{R1}$ can be performed stably if the precharge voltage $V_{PR}$ of the bit lines BL and $\overline{BL}$ is set to any value (for example a value equal to $\frac{1}{2}$ of the power supply voltage Vcc). This is because the transistor $Q_{R0}$ or $Q_{R1}$ at this time is maintained in the nearly off state by the clock signal $\phi_P'$. Consequently, the potential at the node N1 or N2 can be raised stably to a voltage equal to or higher than the power supply voltage, whereby active pull-up operation can always be performed.

Although a memory cell array is divided into four blocks in the above described embodiments, the present invention is not limited thereto. A memory cell array may be divided into any number of blocks.

In addition, although FIG. 1 shows an example of a configuration of an active pull-up circuit, the present invention is not limited to a semiconductor memory device comprising an active pull-up circuit having such configuration. The present invention is also applicable to a semiconductor memory device comprising an active pull-up circuit of other configuration.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a memory cell array divided into a plurality of memory cell array blocks, and
active pull-up operation starting means for starting, sequentially with a prescribed time lag for each of said blocks, active pull-up operation of bit lines included in said respective blocks.

2. A semiconductor memory device in accordance with claim 1, wherein said active pull-up operation starting means comprises active pull-up operation starting signal generating means for generating a plurality of active pull-up operation starting signals corresponding to said respective blocks.

3. A semiconductor memory device in accordance with claim 2, wherein
said active pull-up operation starting signal generating means comprises:
a signal generating circuit for generating one of said plurality of active pull-up operation starting signals, and
delay means for delaying an output signal of said signal generating circuit to form the other signals of said plurality of active pull-up operation starting signals.

4. A semiconductor memory device comprising:
a memory cell array divided into a plurality of memory cell array blocks,
active pull-up operation starting means for starting, sequentially with a prescribed time lag for each of said blocks, active pull-up operation of bit lines included in said respective blocks, and
precharge operation starting means for starting, sequentially with a prescribed time lag for each of said blocks, precharge operation of the bit lines included in said respective blocks.

5. A semiconductor memory device comprising:
a memory cell array divided into a plurality of memory cell array blocks;
active pull-up operation starting means for starting, sequentially with a prescribed time lag for each of said blocks, active pull-up operation of bit lines included in said respective blocks;
precharge operation starting means for starting, sequentially with a prescribed time lag for each of said blocks, precharge operation of the bit lines included in said respective blocks; wherein
said active pull-up operation starting means and said precharge operation starting means control, in an associated manner, timing for starting active pull-up operation and timing for starting precharge operation so that a time length from the start of active pull-up operation to the start of precharge operation in each of said blocks may be a prescribed value at least exceeding a time length required for completion of said active pull-up operation.

6. A semiconductor memory device in accordance with claim 5, wherein
said active pull-up operation starting means comprises active pull-up operation starting signal generating means for generating a plurality of active pull-up operation starting signals corresponding to said respective blocks, and
said precharge operation starting means comprises precharge operation starting signal generating means for generating a plurality of precharge operation starting signals corresponding to said respective blocks, based on said plurality of active pull-up operation starting signals.

7. A semiconductor memory device in accordance with claim 6, wherein
said active pull-up operation starting signal generating means comprises:
a signal generating circuit for generating one of said plurality of active pull-up operation starting signals, and
delay means for delaying an output signal of said signal generating circuit to form the other signals of said plurality of active pull-up operation starting signals.

8. A semiconductor memory device in accordance with claim 6, wherein
said precharge operation starting signal generating means comprises:
first delay means for delaying each of said plurality of active pull-up operation starting signals by said prescribed time length,
second delay means for delaying a row address strobe signal inputted from the exterior to form a row address strobe signal for each of said blocks, and
signal providing means for providing each of said plurality of precharge operation starting signals in response to either an output of said first delay means or an output of said second delay means.

* * * * *